United States Patent [19]
Matsuoka et al.

[11] Patent Number: 5,789,804
[45] Date of Patent: Aug. 4, 1998

[54] CONTACT AGENCY INTERPOSED BETWEEN IC AND IC RECEPTACLE

[75] Inventors: Noriyuki Matsuoka, Yokohama; Kazumi Uratsuji, Tokyo, both of Japan

[73] Assignee: Yamaichi Electronics Co., Ltd., Tokyo, Japan

[21] Appl. No.: 633,549

[22] Filed: Apr. 17, 1996

[30] Foreign Application Priority Data

Apr. 17, 1995 [JP] Japan ................................ 7-116514

[51] Int. Cl.$^6$ ................................ H01L 23/495
[52] U.S. Cl. .................. 257/669; 257/672; 257/673; 257/674; 257/688; 257/689; 257/696; 257/773
[58] Field of Search ................................ 257/666–669, 257/672, 673, 674, 688, 689, 696, 773

[56] References Cited

U.S. PATENT DOCUMENTS

5,389,820  2/1995  Matsuoka ................................ 257/727
5,493,150  2/1996  Matsuoka et al. ....................... 257/668
5,536,969  7/1996  Matsuoka ............................... 257/666

*Primary Examiner*—Edward Wojciechowicz
*Attorney, Agent, or Firm*—Wenderoth, Lind & Ponack

[57] ABSTRACT

Between an IC and an IC receptacle is interposed a flexible wiring sheet, via which contact pieces of the IC and contacts of the IC receptacle are held in contact with one another. In this case, lateral deviation and flexing of the wiring sheet are prevented satisfactorily, and proper contact between the IC and IC receptacle is ensured. A back-up frame is applied by adhesive to the flexible wiring sheet to form a contact agency. The back-up frame 11 has a central window 11 to form a non-backed-up region in a central portion of the flexible wiring sheet 3 that covers the window. The IC 3 and flexible wiring sheet are held in forced contact with each other in the non-backed-up region. The back-up frame has an outer edge portion forming a back-up region for backing up an edge portion of the wiring sheet. In this back-up region, the IC receptacle and the flexible wiring sheet 1 are held in contact with each other.

25 Claims, 10 Drawing Sheets

CONTACT AGENCY INTERPOSED BETWEEN IC AND IC RECEPTACLE

BACKGROUND OF THE INVENTION

1. Field of the Invention

This invention relates to contact agencies to be interposed between an IC and an IC receptacle.

2. Prior Art

In the prior art, an IC and an IC receptacle are held in electric contact with each other by directly mounting contact pieces of the IC on contact members of the IC receptacle.

It is a recent trend that the IC contact piece pitch is becoming much smaller, but it is difficult for the IC receptacle contact member pitch to follow this trend. To overcome this drawback, it has been thought to interpose a flexible wiring sheet between the IC and IC receptacle to obtain contact of the IC and IC receptacle with each other via the flexible wiring sheet. The wiring sheet, however, has flexibility, and it is difficult to obtain adequate positioning of the contact pieces of the IC and the contact portions of the contact members relative to one another. It may be thought to back up the wiring sheet with a rigid member. Even by so doing, however, subtle lateral deviation of the wiring sheet and free flexing thereof to the side opposite the backed-up surface take place. Due to the combined occurrence of the lateral deviation and flexing of the wiring sheet, it is difficult to obtain adequate positioning of the IC contact pieces and contact portions of the contact members.

The rigid member that backs up the wiring sheet further leads to a drawback that it is difficult to ensure an elastic state of forced contact between the IC and the wiring sheet.

SUMMARY OF THE INVENTION

According to the invention, the structure of contact between IC and IC receptacle via a contact agency between the two, is provided by providing a rigid laminate structure by applying a back-up plate via adhesive on the flexible wiring sheet.

With the contact agency having the laminate structure according to the invention, in which the back-up frame is applied by adhesive to the wiring sheet to impart rigidity thereto, no lateral deviation of the wiring sheet with flexing thereof takes place, and it is possible to effectively eliminate lateral deviation and flexing of the wiring sheet which make the contact between the IC and IC receptacle instable.

The back-up frame has a window region formed by its central window. In this window region, forced contact state between the IC and the wiring sheet portion covering the window is ensured. An edge portion of the wiring sheet which is supported by the corresponding edge portion of the back-up frame, is given rigidity, and a forced contact state of elastic contact members provided on the IC receptacle can be adequately formed.

The central window of the back-up frame guarantees the elasticity of the wiring sheet portion corresponding to the window, as well as receiving the IC such as to be in contact with the wiring sheet.

The window further receives the elastic member provided on the IC receptacle to push the wiring sheet portion corresponding to it against the IC to be in a forced contact state.

DETAILED DESCRIPTION OF THE PREFERRED EMBODIMENTS

The invention will now be described with reference to FIGS. 1 to 10.

Figure 1:
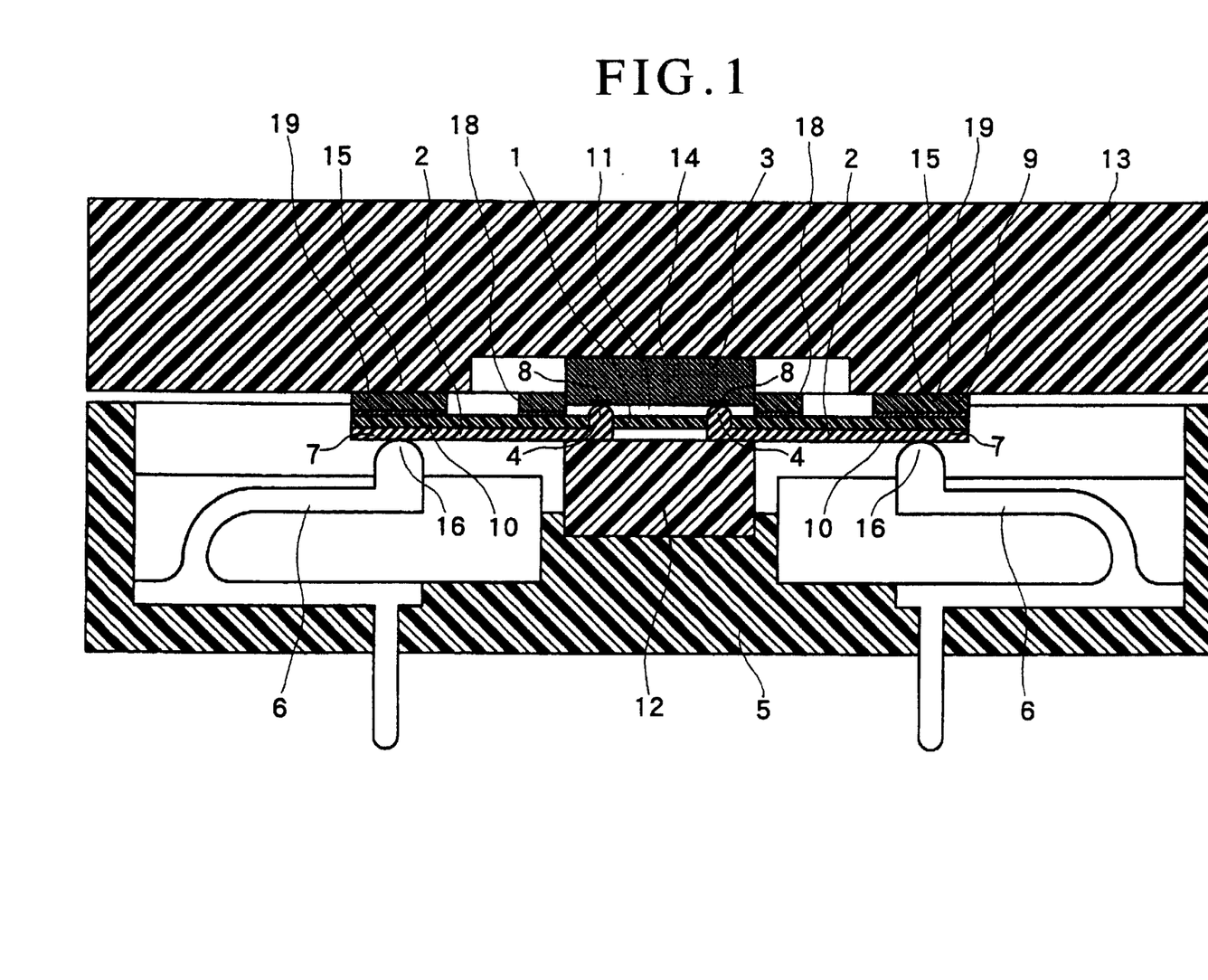
FIG. 1 is a sectional view showing a contact agency and an IC mounted in an IC receptacle and in contact with each other.
Figure 2:
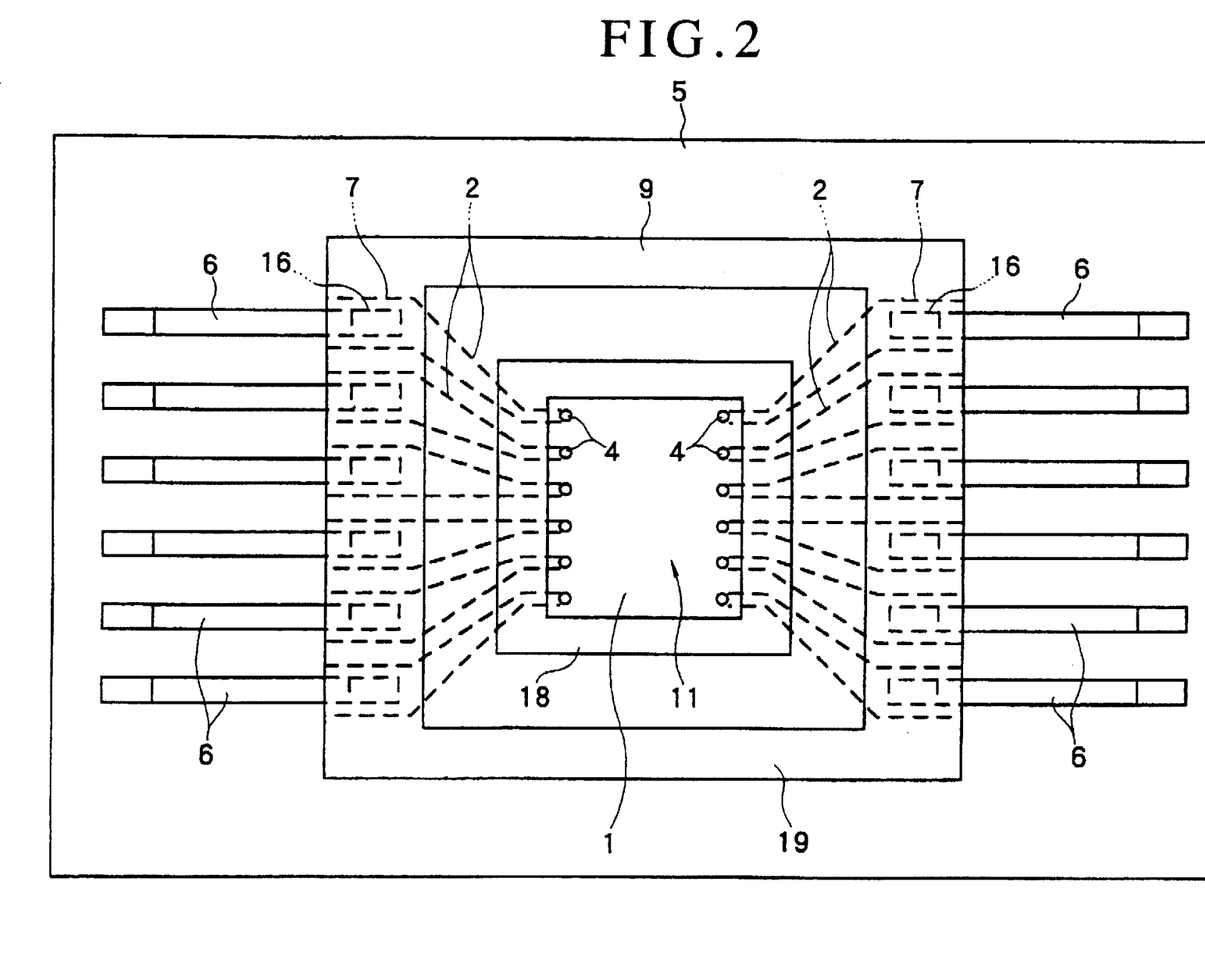
FIG. 2 is a plan view showing the IC receptacle shown in FIG. 1 with a retainer and the IC removed.

Referring to FIGS. 1 and 2, a wiring sheet 1 and a lead pattern 2 are in contact. The lead pattern 2 extends in parallel with the wiring sheet 1 from a central portion to an outer portion thereof. The lead pattern 2 has bumps 4 formed along its inner edge to be in contact with an IC 3. The lead pattern 2 has pads 7 formed along its outer edge to be in contact with contact members 6 of the IC receptacle 5.

The bumps 4 are formed at a small pitch along the inner lead pattern edge in correspondence to contact pieces 8 formed on the lower surface of the IC 3. The pads 7 are formed along the outer lead pattern edge in correspondence to the contact members 6 of the IC receptacle 5.

A back-up frame 9 is applied with adhesive 10 to the surface of the flexible wiring sheet 1, thus forming a contact agency having a laminate structure. The back-up frame 9 provides rigidity to the wiring sheet 1 to maintain parallelness thereof.

Figure 3:
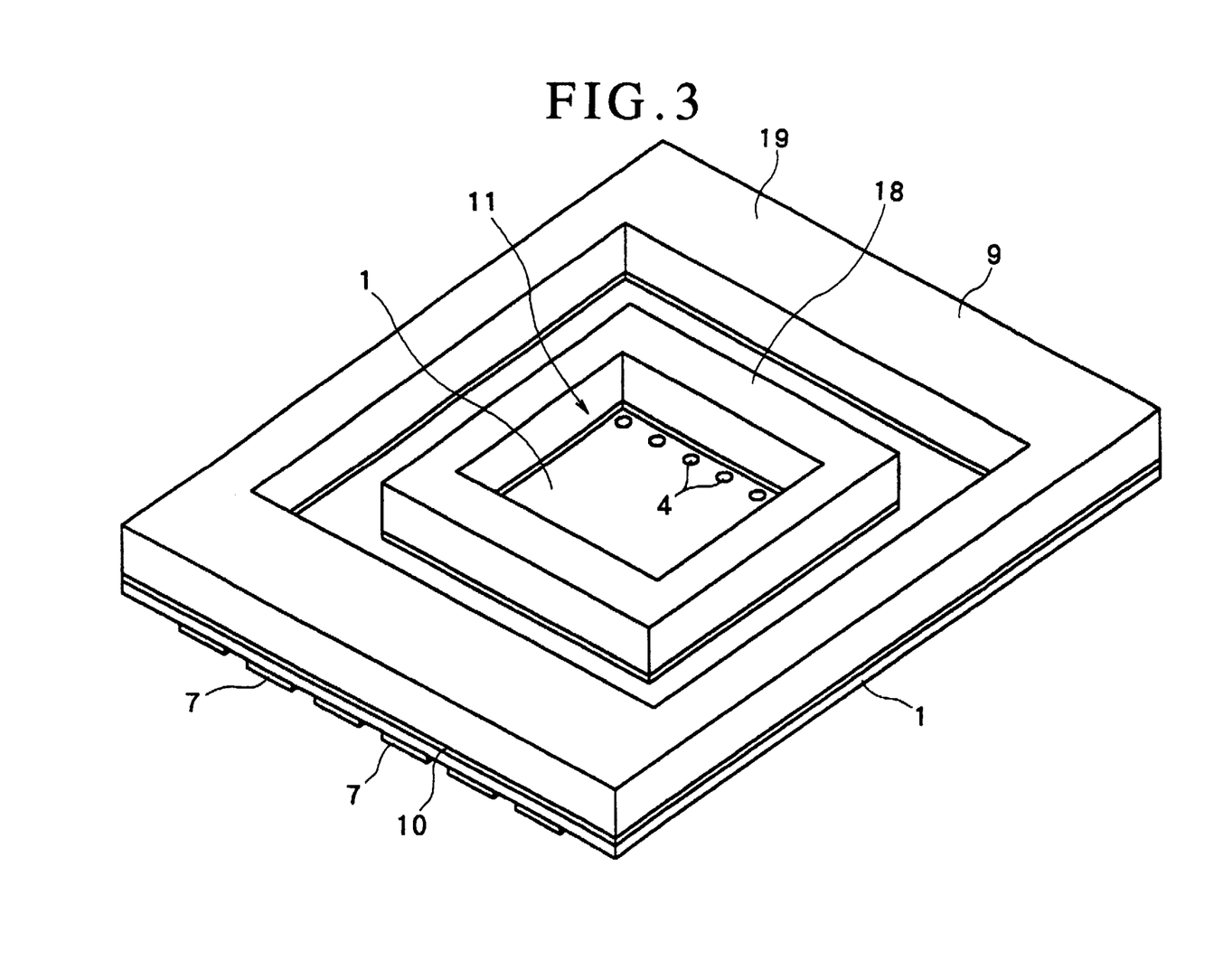
FIG. 3 is a perspective view showing the contact agency viewed from the front side.
Figure 4:
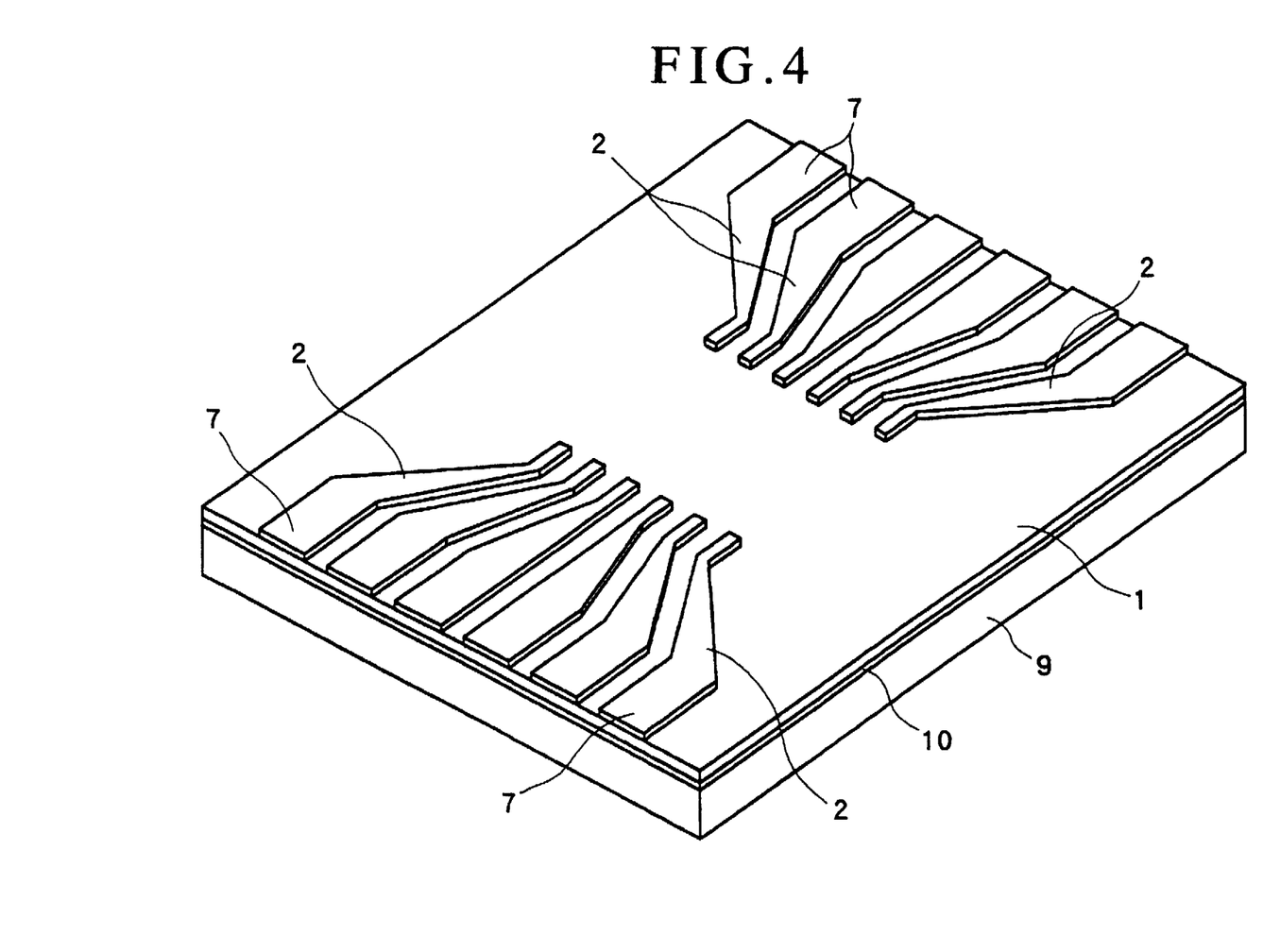
FIG. 4 is a perspective view showing the contact agency viewed from the other side.

FIGS. 3 and 4 show a specific example of the back-up frame 9. As shown, the back-up frame 9 has a central rectangular inner frame 18, which has a central window 11 for accommodating the IC 3 or an elastic member 12, and an outer rectangular frame 19 (pressure application frame) with the edges thereof defining the four sides of the back-up frame 9. The flexible wiring sheet 1 is applied by adhesive 10 to the surfaces of the frames 18 and 19.

In the case shown in FIGS. 1 to 4, the back-up frame 9 is applied to the surface of the flexible wiring sheet 1 on the side thereof opposite the lead pattern 2 so that a laminate structure is formed by the two parts 1 and 9, and the bumps 4 of the lead pattern 2 project from the surface of the wiring sheet 1 on the side thereof opposite the lead pattern 2, while forming the pads 7 on the lead pattern surface to which the wiring sheet is applied.

Figure 5:
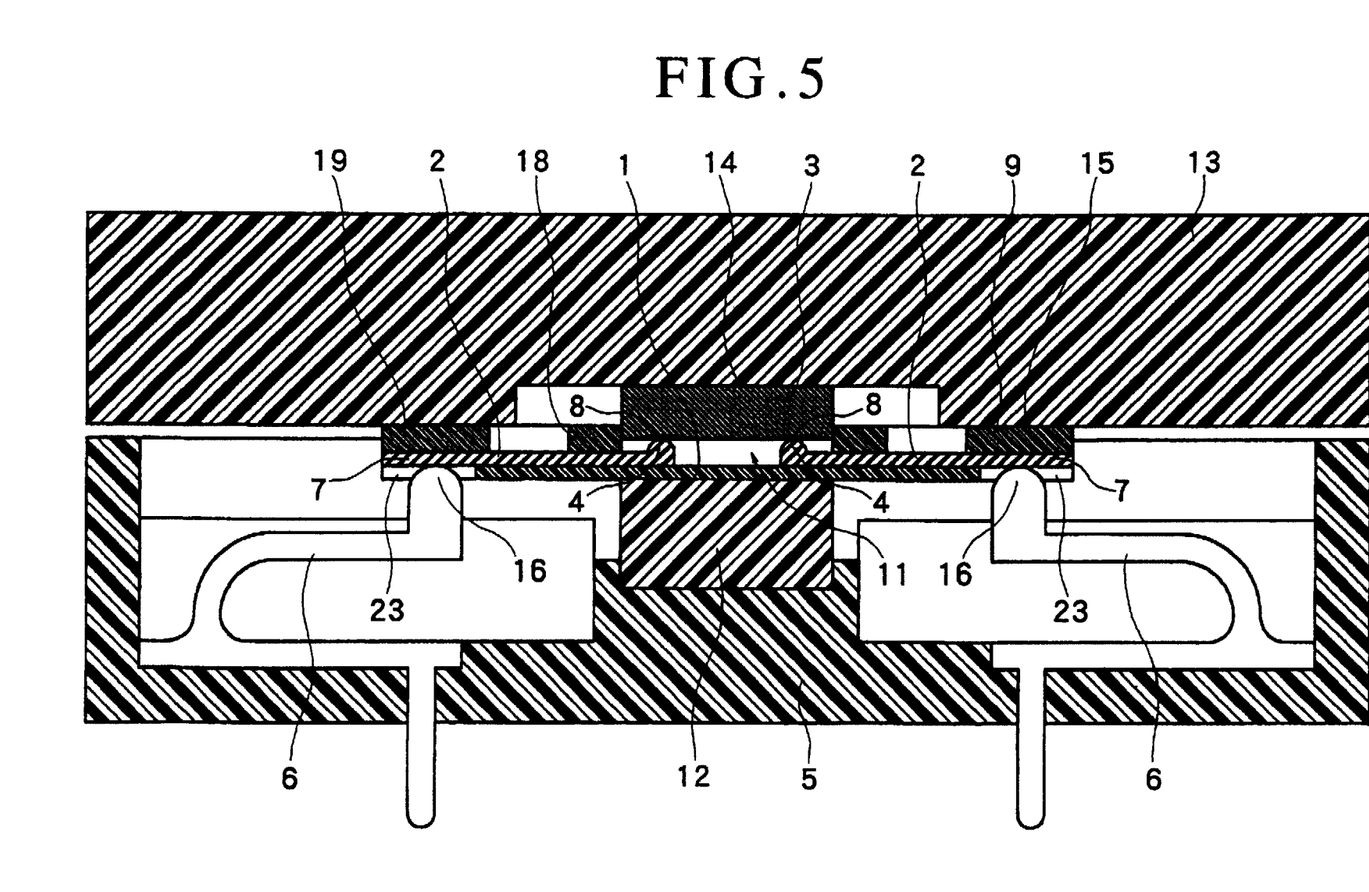
FIG. 5 is a view similar to FIG. 1 but showing a different embodiment of the invention.
Figure 6:
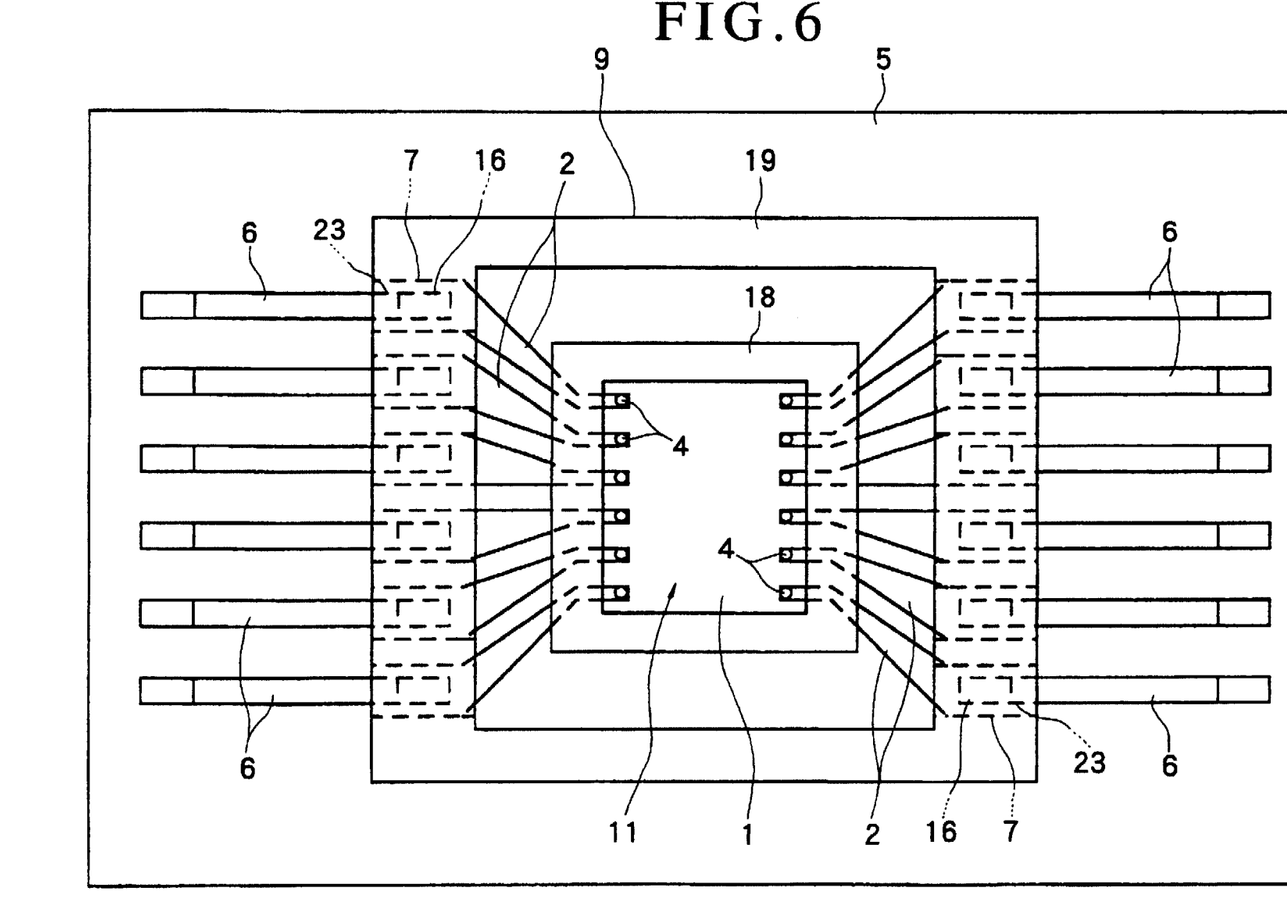
FIG. 6 is a view similar to FIG. 2 but concerning the embodiment shown in FIG. 5.

In the case shown in FIGS. 5 and 6, while the back-up frame 9 is applied to the surface of the flexible wiring sheet 1 on the side thereof opposite the lead pattern 2 so that a laminate structure is formed by the two parts 1 and 9 and the bumps 4 of the lead pattern 2 project from the surface of the wiring sheet 1 on the side thereof opposite the lead pattern 2, the pads 7 are provided on the side of the lead pattern surface opposite the wiring sheet 1 and are exposed for contact with the contact members 6.

The wiring sheet 1 is formed adjacent the outer edge (outer frame 19) with grooves or holes 23 for receiving the contact portions 16 of the contact members 6. The holes 23 expose the pads 7 for contact 16 the contact members 6 received therein.

Figure 7:
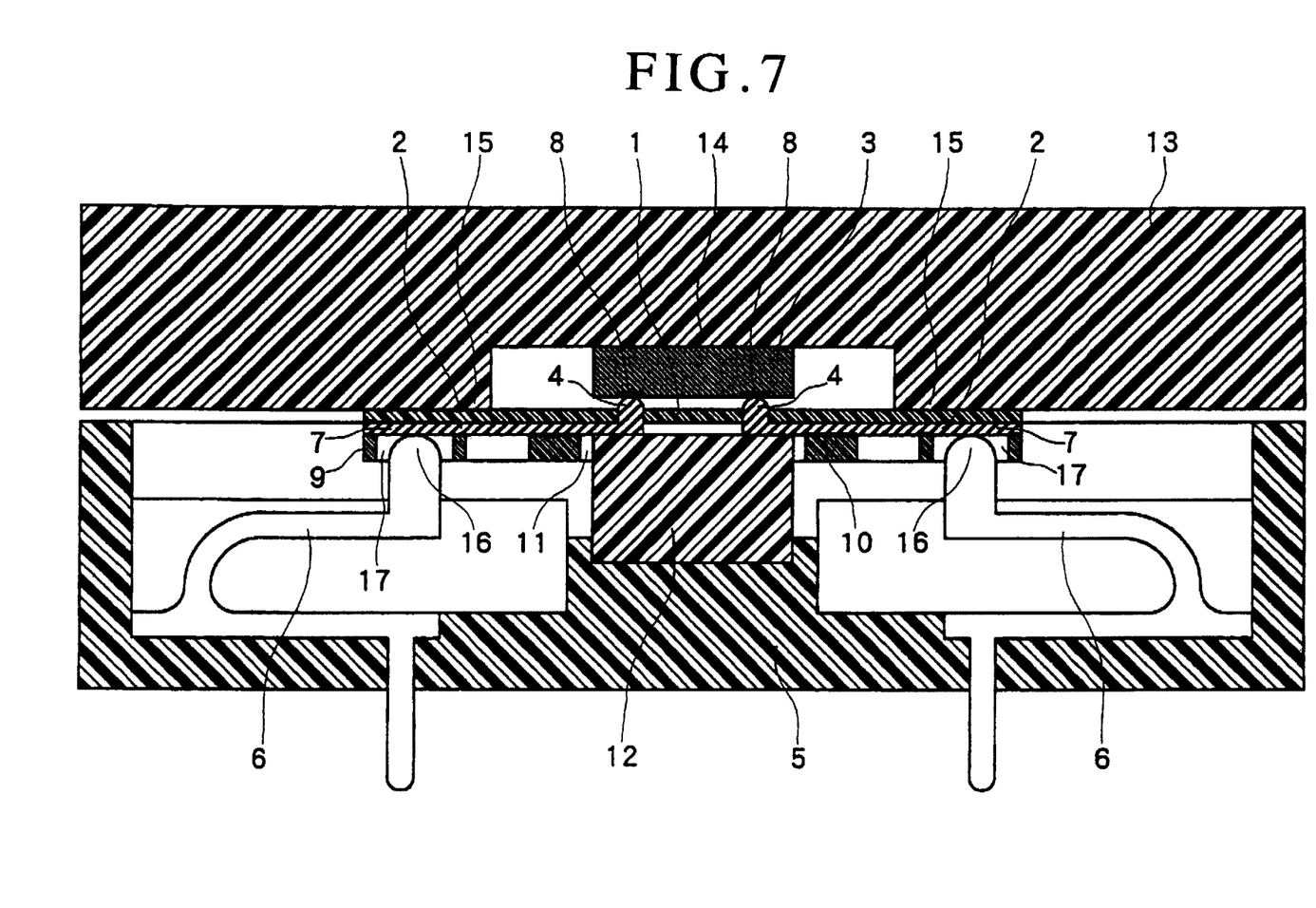
FIG. 7 is a view similar to FIG. 1 but showing a further embodiment of the invention.
Figure 8:
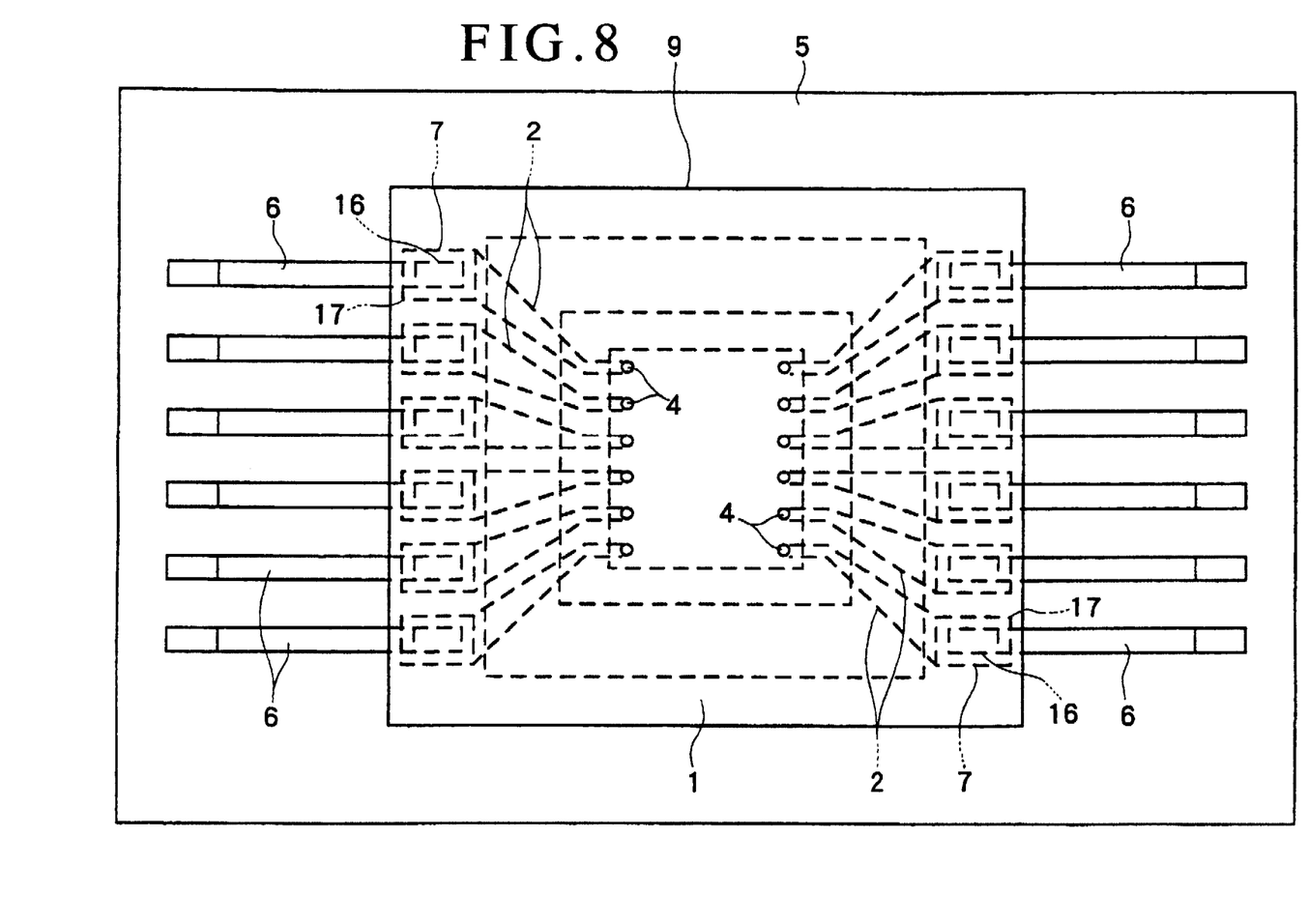
FIG. 8 is a view similar to FIG. 2 but concerning the embodiment shown in FIG. 7.

In the case shown in FIGS. 7 and 8, while the back-up frame 9 is applied to the surface of the flexible wiring sheet 1 on the side thereof having the lead pattern 2 so that a laminate structure is formed by the two parts 1 and 9 and the bumps 4 of the lead pattern 2 project from the surface of the wiring sheet 1 on the side thereof opposite the lead pattern 2, the pads 7 are provided on the side of the wiring sheet having the lead pattern 2.

In the embodoiment shown in FIGS. 1 to 4, the embodiment shown in FIGS. 5 and 6 and the embodiment shown in FIG. 7 and 8, the back-up frame 9 has a central window 11, which is covered by the wiring sheet 1, and the central portion of the wiring sheet 1 corresponding to the window 11 constitutes a non-backed-up region. The bumps 4 disposed at the central part of the wiring sheet 1 are found in the area of the window 11.

In the embodiment shown in FIGS. 1 to 4 and embodiment shown in FIGS. 5 and 6, the bumps 4 are directed inwardly of the window 11 (i.e. extend into the window 11), while in the embodiment shown in FIGS. 7 and 8 they are directed outwardly (i.e. away from the window 11).

In the cases shown in FIGS. 1 to 6, the IC 3 is received in the window 11 forming the non-backed-up region noted above from one opening of the window 11, and rests on the central portion of the wiring sheet 1 covering the other opening of the window 11 such that the contact pieces 8 of the IC 3 are in contact with the bumps 4. Alternatively, the contact pieces 8 and bumps 4 face one another in a spaced-apart relation before mounting in the IC receptacle 5.

As shown in FIG. 1, an elastic member 12, for instance a silicone rubber block, is disposed in a central portion of the IC receptacle 5, i.e., a portion thereof facing the window 11. The elastic member 12 pushes the central portion of the wiring sheet 1 to push the bumps 4 against the contact pieces 8 of the IC 3, thus providing a state of forced contact.

The IC receptacle 5 is closed by a retainer 13. The retainer 13 has a pushing portion 14 for pushing the IC 3 against the wiring sheet 1. As a result, the central portion of the wiring sheet 1 is caused to flex slightly at the window 11, thus compressing the elastic member 12 to have the bumps 4 forced into contact with the contact pieces 8 by the reaction force.

The side surfaces of the IC 3 are restricted and positioned by the inner surfaces of the window 1. The retainer 13 has a contact pushing portion 15 for pushing an edge portion of the back-up frame 9. The contact pushing portion 15 pushes the edge portion of the wiring sheet 1 against the contact portions 16 of the contact members 6 of the IC receptable 5 to cause flexing of the contact members 16, thus having the contact portions 6 of the contact members 6 forced into contact with the pads 7 provided on the wiring sheet 1 adjacent the edge thereof by the reaction force.

In the case shown in FIGS. 7 and 8, an elastic member 12 facing the window 11 is provided in correspondence to central portion of the IC receptacle. The elastic member 12 is received in the window 11 to push the central portion of the wiring sheet 1 facing the window 11 so as to the push the bumps 4 corresponding to the central portion of the wiring sheet 1 against the contact pieces 8 of the IC 3. Like the above cases, the retainer 13 has a central IC pushing portion 14 for pushing the IC 3 and compressing the elastic member 12, and a contact pushing portion 15 formed along the edge for pushing the edge portion of the wiring sheet 1 and the corresponding edge portion of the back-up frame 9.

Also, in the case of FIGS. 7 and 8, the back-up frame 9 has a plurality of contact receiving holes 17 formed adjacent its edge. The contact portions 16 of the contact members 6 are received in the contact receiving holes 17 from one open side thereof, the contact receiving holes 17 are covered on the other open side by the wiring sheet 1. The pads 7 of the wiring sheet 1 are exposed through the contact receiving holes 17, and the contact portions 16 of the contact members 6 are held in forced contact with the pads 7 via the holes 17.

The contact receiving holes 17 position the contact portions 16 of the contact members 6. When the wiring sheet 1 is occasionally displaced in unison with the back-up frame 9, the contact portions 16 of the contact members 6 are also displaced by following the movement, thus maintaining their relative position with respect to the pads 7. The back-up frame 9 is applied by adhesive 10 to the wiring sheet 1, thus forming a contact agency. The edge portion of the back-up frame 9 corresponds in position to the edge portion of the wiring sheet 1, and the wiring sheet 1 forms a state of contact with the contact members 6 in the backed-up regions. As shown in FIG. 7, the back-up frame 9 has contact receiving portions 17 formed adjacent it outer edge.

Figure 9:
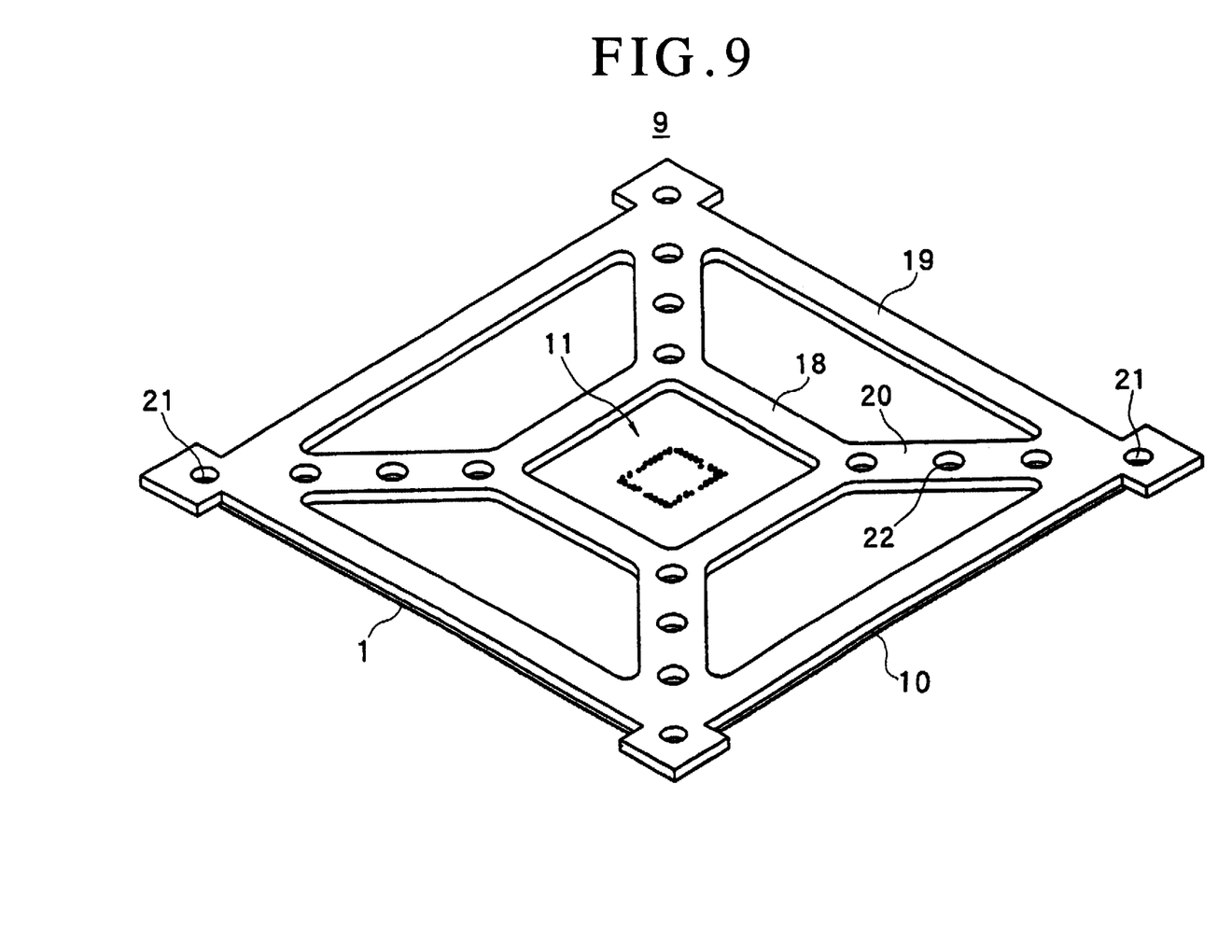
FIG. 9 is a perspective view showing a further example of the contact agency and FIG. 10 is a perspective view showing the contact agency of FIG. 9 viewed from the opposite side.
Figure 10:
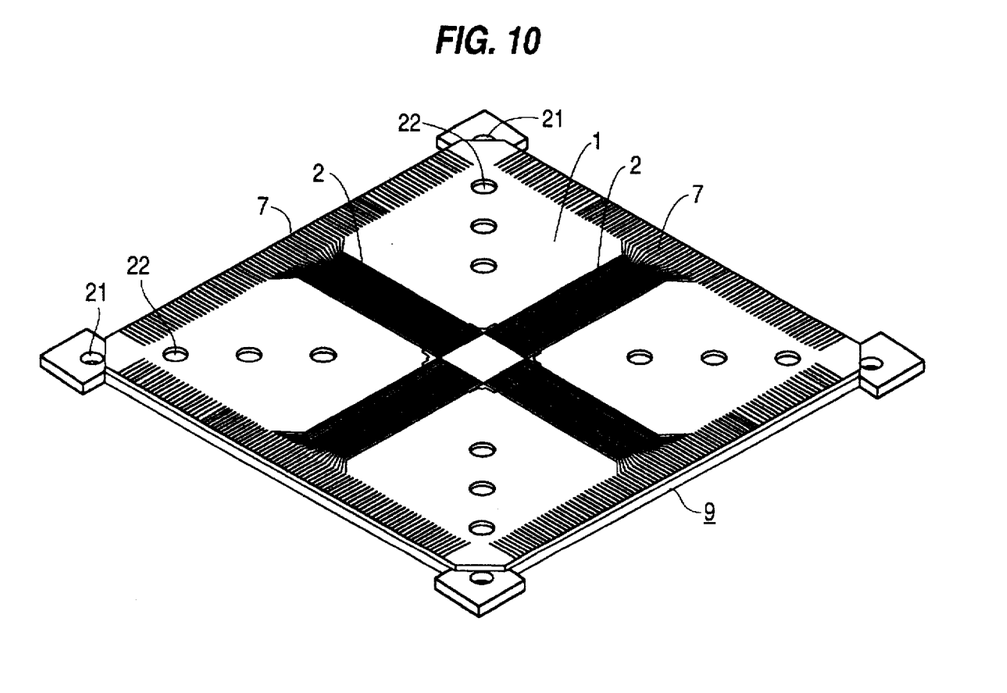

FIGS. 9 and 10 show a specific example of the back-up frame 9. As shown, the back-up frame 9 has a central rectangular inner frame 18, which has a rectangular window 11 for accommodating the IC 3 or the elastic member 12, a rectangular outer frame 19 (pressure application frame), which defines the four sides of the back-up frame, and connecting frames 20, which connect the corners of the inner frame 18 and those of the outer frame 19. The flexible wiring sheet 1 is applied by adhesive 10 to the surface of the frames 18 to 20, thus forming a contact agency.

The outer frame 18 is applied to the surface of the edge portion of the wiring sheet 1 to be held in forced contact with the contact members 6. The corners of the back-up frame 9 have holes 21, through which positioning pins for positioning the IC receptacle are inserted. The back-up frame 9 further has holes 22, through which securing pins of the retainer 13 penetrating the wiring sheet 1 are inserted.

The securing pins of the retrainer 13 extend through the holes 22 to be pressure fitted in a carrier plate, for instance, which holds together the flexible wiring sheet 1 and IC 3. The contact agency noted above is sandwiched between the carrier plate and the back-up frame 9. While in the above case the bumps 4 are provided on the wiring sheet 1 (i.e. as part of the lead pattern 2), it is also possible to have the bumps 4 project from the lower surface of the IC 3 and provide flat pads on the wiring sheet 1. The bumps and flat pads can be referred to collectively as "pads".

In the cases of FIGS. 5 and 7, the contact agency and the IC are mounted in the IC receptacle and held in the state of contact as noted above. However, it is also possible to support the contact agency and the IC in face-to-face relation to each other on an IC carrier which is mounted in the IC receptacle.

According to the invention, in the case where the flexible wiring sheet is interposed between the IC and IC receptacle to let the contact pieces of the IC and the contact members of the IC receptacle be in contact with one another via the wiring sheet, lateral deviation or flexing of the wiring sheet can be satisfactorily prevented to ensure proper contact positions of the IC and IC receptacle. In addition, in the central window region of the back-up frame, the portion of the wiring sheet covering the window attains an adequate state of forced contact with the IC, while the outer edge portion of the back-up frame backs up the edge portion of the wiring sheet and receives the reaction force of the contact members of the IC receptacle.

The central window of the back-up frame guarantees elasticity of the portion of the wiring sheet corresponding to the window, and it can receive the IC and enable proper contact of the IC with the wiring sheet. In addition, the window can receive the elastic member provided in the IC receptacle to let the wiring sheet portion corresponding to the window be pushed against the IC so as to obtain a forced contact state.

The contact agency which is formed as a laminate of the wiring sheet and back-up frame can be handled as a single product. Furthermore, while obtaining proper contact between the wiring sheet and IC with the formation of the central window in the back-up frame, proper contact between the wiring sheet and IC receptacle can be obtained with the contact receiving holes formed in the back-up frame (i.e., outer frame thereof) adjacent the outer edge thereof.

What is claimed is:

1. A contact agency for use in effecting electrical contact between conductive contact pieces of an IC and conductive contact members of an IC receptacle, said contact agency comprising:
    a flexible wiring sheet having first and second opposing surfaces, a plurality of conductive inner pads on an inner portion thereof for electrically contacting the contact pieces, respectively, of the IC, a plurality of conductive outer pads on an outer portion thereof for electrically contacting the contact members, respectively, of the IC receptacle, and a lead pattern including a plurality of conductive leads extending between and electrically connecting said conductive outer pads and said conductive inner pads, respectively;
    a rigid back-up frame adhered to said first surface of said flexible wiring sheet to form a laminate structure therewith;
    wherein said back-up frame has a central window formed therein to form a non-backed-up flexible region of said flexible wiring sheet in which said flexible wiring sheet is allowed to flex;
    wherein portions of said flexible wiring sheet outside of said non-backed-up flexible region constitute a backed-up rigid region;
    wherein said conductive inner pads of said flexible wiring sheet are disposed in said non-backed-up flexible region; and
    wherein said conductive outer pads of said flexible wiring sheet are disposed in said backed-up rigid region and outwardly of said central window of said back-up frame.

2. A contact agency as recited in claim 1, wherein
    said central window of said back-up frame constitutes an IC accommodating window for accommodating the IC such that the contact pieces of the IC contact said conductive inner pads of said wiring sheet.

3. A contact agency as recited in claim 2, wherein
    said back-up frame includes a pressure application frame portion constituting an outer peripheral portion of said back-up frame for forcing said conductive outer pads of said wiring sheet into pressure contact with the contact members of the IC receptacle.

4. A contact agency as recited in claim 1, wherein
    said back-up frame includes a pressure application frame portion constituting an outer peripheral portion of said back-up frame for forcing said conductive outer pads of said wiring sheet into pressure contact with the contact members of the IC receptacle.

5. A contact agency as recited in claim 1, wherein
    said back-up frame has contact-receiving holes formed adjacent an outer periphery thereof for receiving the contact members of the IC receptacle to allow the contact members to contact said conductive outer pads of said wiring sheet through said contact-receiving holes and to cause lateral shifting of the contact members upon lateral shifting of said wiring sheet.

6. A contact agency as recited in claim 1, wherein
    said wiring sheet has contact-receiving holes formed adjacent an outer periphery thereof for receiving the contact members of the IC receptacle to allow the contact members to contact said conductive outer pads of said wiring sheet through said contact-receiving holes and to cause lateral shifting of the contact members upon lateral shifting of said wiring sheet.

7. A contact agency as recited in claim 1, wherein
    said back-up frame comprises a rectangular inner frame defining therewithin said central window, a rectangular outer frame disposed outwardly of said inner frame, and connecting frames extending between and connecting said inner frame and said outer frame.

8. A contact arrangement for use in electrically contacting an IC having contact pieces, said contact arrangement comprising:
    an IC receptacle having a plurality of contact members;
    a flexible wiring sheet having first and second opposing surfaces, a plurality of conductive inner pads on an inner portion thereof for electrically contacting the contact pieces, respectively, of the IC, a plurality of conductive outer pads on an outer portion thereof electrically contacting said contact members, respectively, of said IC receptacle, and a lead pattern including a plurality of conductive leads extending between and electrically connecting said conductive outer pads and said conductive inner pads, respectively;
    a rigid back-up frame adhered to said first surface of said flexible wiring sheet to form a laminate structure therewith;
    wherein said back-up frame has a central window formed therein to form a non-backed-up flexible region of said flexible wiring sheet in which said flexible wiring sheet is allowed to flex;
    wherein portions of said flexible wiring sheet outside of said non-backed-up flexible region constitute a backed-up rigid region;
    wherein said conductive inner pads of said flexible wiring sheet are disposed in said non-backed-up flexible region; and
    wherein said conductive outer pads of said flexible wiring sheet are disposed in said backed-up rigid region and outwardly of said central window of said back-up frame.

9. A contact arrangement as recited in claim 8, wherein
    said central window of said back-up frame constitutes an IC accommodating window for accommodating the IC such that the contact pieces of the IC contact said conductive inner pads of said wiring sheet.

10. A contact arrangement as recited in claim 9, wherein
    said back-up frame includes a pressure application frame portion constituting an outer peripheral portion of said back-up frame for forcing said conductive outer pads of said wiring sheet into pressure contact with said contact members of said IC receptacle.

11. A contact arrangement as recited in claim 8, wherein said back-up frame includes a pressure application frame portion constituting an outer peripheral portion of said back-up frame for forcing said conductive outer pads of said wiring sheet into pressure contact with said contact members of said IC receptacle.

12. A contact arrangement as recited in claim 8, wherein said back-up frame has contact-receiving holes formed adjacent an outer periphery thereof and receiving said contact members of said IC receptacle to allow said contact members to contact said conductive outer pads of said wiring sheet through said contact-receiving holes and to cause lateral shifting of said contact members upon lateral shifting of said wiring sheet.

13. A contact arrangement as recited in claim 8, wherein said wiring sheet has contact-receiving holes formed adjacent an outer periphery thereof for receiving said contact members of said IC receptacle to allow said contact members to contact said conductive outer pads of said wiring sheet through said contact-receiving holes and to cause lateral shifting of said contact members upon lateral shifting of said wiring sheet.

14. A contact arrangement as recited in claim 8, wherein said back-up frame comprises a rectangular inner frame defining therewithin said central window, a rectangular outer frame disposed outwardly of said inner frame, and connecting frames extending between and connecting said inner frame and said outer frame.

15. A contact arrangement as recited in claim 8, wherein said IC receptacle comprises a support portion; and an elastic member interposed between said support portion of said IC receptacle and said non-backed-up flexible region of said flexible wiring sheet.

16. A contact arrangement as recited in claim 15, further comprising a retainer cover removably mounted on said IC receptacle for pressing the IC toward said elastic member and for pressing said backed-up rigid region of said wiring sheet toward said contact members of said IC receptacle.

17. A contact arrangement comprising:

an IC receptacle having a plurality of contact members;

an IC having a plurality of contact pieces;

a flexible wiring sheet having first and second opposing surfaces, a plurality of conductive inner pads on an inner portion thereof electrically contacting said contact pieces, respectively, of said IC, a plurality of conductive outer pads on an outer portion thereof electrically contacting said contact members, respectively, of said IC receptacle, and a lead pattern including a plurality of conductive leads extending between and electrically connecting said conductive outer pads and said conductive inner pads, respectively;

a rigid back-up frame adhered to said first surface of said flexible wiring sheet to form a laminate structure therewith;

wherein said back-up frame has a central window formed therein to form a non-backed-up flexible region of said flexible wiring sheet in which said flexible wiring sheet is allowed to flex;

wherein portions of said flexible wiring sheet outside of said non-backed-up flexible region constitute a backed-up rigid region;

wherein said conductive inner pads of said flexible wiring sheet are disposed in said non-backed-up flexible region; and wherein said conductive outer pads of said flexible wiring sheet are disposed in said backed-up rigid region and outwardly of said central window of said back-up frame.

18. A contact arrangement as recited in claim 17, wherein said central window of said back-up frame constitutes an IC accommodating window in which said IC is accommodated such that said contact pieces of said IC contact said conductive inner pads of said wiring sheet.

19. A contact arrangement as recited in claim 18, wherein said back-up frame includes a pressure application frame portion constituting an outer peripheral portion of said back-up frame for forcing said conductive outer pads of said wiring sheet into pressure contact with said contact members of said IC receptacle.

20. A contact arrangement as recited in claim 17, wherein said back-up frame includes a pressure application frame portion constituting an outer peripheral portion of said back-up frame for forcing said conductive outer pads of said wiring sheet into pressure contact with said contact members of said IC receptacle.

21. A contact arrangement as recited in claim 17, wherein said back-up frame has contact-receiving holes formed adjacent an outer periphery thereof and receiving said contact members of said IC receptacle to allow said contact members to contact said conductive outer pads of said wiring sheet through said contact-receiving holes and to cause lateral shifting of said contact members upon lateral shifting of said wiring sheet.

22. A contact arrangement as recited in claim 17, wherein said wiring sheet has contact-receiving holes formed adjacent an outer periphery thereof for receiving said contact members of said IC receptacle to allow said contact members to contact said conductive outer pads of said wiring sheet through said contact-receiving holes and to cause lateral shifting of said contact members upon lateral shifting of said wiring sheet.

23. A contact arrangement as recited in claim 17, wherein said back-up frame comprises a rectangular inner frame defining therewithin said central window, a rectangular outer frame disposed outwardly of said inner frame, and connecting frames extending between and connecting said inner frame and said outer frame.

24. A contact arrangement as recited in claim 17, wherein said IC receptacle comprises a support portion; and an elastic member interposed between said support portion of said IC receptacle and said non-backed-up flexible region of said flexible wiring sheet.

25. A contact arrangement as recited in claim 24, further comprising a retainer cover removably mounted on said IC receptacle for pressing said IC toward said elastic member and for pressing said backed-up rigid region of said wiring sheet toward said contact members of said IC receptacle.

* * * * *